United States Patent
Ohuchi et al.

(10) Patent No.: US 9,035,293 B2
(45) Date of Patent: May 19, 2015

(54) ORGANIC EL DEVICE INCLUDING A MIXED HOLE INJECTION LAYER

(75) Inventors: Satoru Ohuchi, Osaka (JP); Hirofumi Fujita, Ehime (JP); Shinya Fujimura, Osaka (JP); Takahiro Komatsu, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/126,482

(22) PCT Filed: Sep. 4, 2012

(86) PCT No.: PCT/JP2012/005590
§ 371 (c)(1),
(2), (4) Date: Dec. 16, 2013

(87) PCT Pub. No.: WO2013/157058
PCT Pub. Date: Oct. 24, 2013

(65) Prior Publication Data
US 2014/0175411 A1    Jun. 26, 2014

(30) Foreign Application Priority Data
Apr. 18, 2012    (JP) ................................. 2012-094398

(51) Int. Cl.
*H01L 21/00* (2006.01)
*H01L 51/50* (2006.01)
*H01L 51/56* (2006.01)

(52) U.S. Cl.
CPC ......... *H01L 51/5088* (2013.01); *H01L 51/5012* (2013.01); *H01L 51/56* (2013.01)

(58) Field of Classification Search
CPC .. H01L 51/5088; H01L 51/5012; H01L 51/56
USPC .................................................... 257/40, 88
See application file for complete search history.

(56) References Cited

U.S. PATENT DOCUMENTS

| 5,443,922 A | 8/1995 | Nishizaki et al. |
| 5,981,092 A | 11/1999 | Arai et al. |

(Continued)

FOREIGN PATENT DOCUMENTS

| JP | 5-163488 | 6/1993 |
| JP | 9-260063 | 10/1997 |

(Continued)

OTHER PUBLICATIONS

U.S. Appl. No. 14/235,895 to Masaki Aonuma et al., filed Jan. 29, 2014.

(Continued)

*Primary Examiner* — Laura Menz
(74) *Attorney, Agent, or Firm* — Greenblum & Bernstein, P.L.C.

(57) ABSTRACT

Organic EL device comprising: anode and cathode disposed to face each other with gap therebetween; functional layer that contains organic material and is disposed between the anode and the cathode; and hole injection layer that has function to inject holes into the functional layer and is disposed between the anode and the functional layer, wherein the hole injection layer is mixture layer containing first oxide and second oxide. The first oxide is p-type metal oxide, the composition of the second oxide contains element that is thermally stable in both first state where the element has the maximum valence and second state where the element has valence smaller than the maximum valence, the element being more thermally stable in the second state than in the first state. The element contained in the composition of the second oxide in the hole injection layer is in the first state.

7 Claims, 6 Drawing Sheets

(56) References Cited

U.S. PATENT DOCUMENTS

| | | | |
|---|---|---|---|
| 8,664,669 B2* | 3/2014 | Ohuchi et al. | 257/88 |
| 8,703,530 B2* | 4/2014 | Ohuchi et al. | 438/99 |
| 8,829,510 B2* | 9/2014 | Komatsu et al. | 257/40 |
| 8,866,160 B2* | 10/2014 | Nishiyama | 257/79 |
| 8,884,281 B2* | 11/2014 | Ohuchi et al. | 257/40 |
| 8,890,173 B2* | 11/2014 | Harada et al. | 257/79 |
| 8,890,174 B2* | 11/2014 | Harada et al. | 257/79 |
| 8,927,976 B2* | 1/2015 | Nishiyama et al. | 257/40 |
| 2003/0006411 A1* | 1/2003 | Kido et al. | 257/40 |
| 2009/0160325 A1* | 6/2009 | Yatsunami et al. | 313/504 |
| 2009/0243475 A1 | 10/2009 | Shoda et al. | |
| 2012/0061656 A1 | 3/2012 | Ohuchi et al. | |
| 2012/0132934 A1* | 5/2012 | Ohuchi et al. | 257/88 |
| 2013/0056719 A1 | 3/2013 | Komatsu et al. | |
| 2013/0105780 A1* | 5/2013 | Ohuchi et al. | 257/40 |
| 2013/0119366 A1* | 5/2013 | Nishiyama et al. | 257/40 |
| 2013/0126840 A1* | 5/2013 | Fujimura et al. | 257/40 |
| 2013/0126843 A1* | 5/2013 | Nishiyama et al. | 257/40 |
| 2013/0126848 A1* | 5/2013 | Harada et al. | 257/40 |
| 2013/0140542 A1* | 6/2013 | Harada et al. | 257/40 |
| 2013/0328038 A1* | 12/2013 | Taneda et al. | 257/40 |
| 2014/0034937 A1* | 2/2014 | Fujita et al. | 257/40 |
| 2014/0042423 A1* | 2/2014 | Ohuchi et al. | 257/40 |
| 2014/0097425 A1* | 4/2014 | Fujita et al. | 257/40 |
| 2014/0127846 A1* | 5/2014 | Yamada et al. | 438/46 |
| 2014/0145172 A1* | 5/2014 | Yamada et al. | 257/40 |
| 2014/0147952 A1* | 5/2014 | Yamada et al. | 438/46 |
| 2014/0175411 A1* | 6/2014 | Ohuchi et al. | 257/40 |
| 2014/0312324 A1* | 10/2014 | Mishima | 257/40 |

FOREIGN PATENT DOCUMENTS

| | | |
|---|---|---|
| JP | 2010-103460 | 5/2010 |
| JP | 2011-044445 | 3/2011 |

OTHER PUBLICATIONS

U.S. Appl. No. 14/103,885 to Hirofumi Fujita et al., filed Dec. 12, 2013.

International Search Report (ISR) in International Patent Application No. PCT/JP2012/005590, dated Dec. 11, 2012.

Suman Nandy et al., "Effect of oxygen partial pressure on the electrical and optical properties of highly (200) oriented p-type $Ni_{1-x}O$ ?lms by DC sputtering.", Journal Mater Science, vol. 42, Apr. 20, 2007, pp. 5766-5772.

Wei-Luen Jang et al., "Point defects in sputtered NiO films", Applied Physics Letters, vol. 94, No. 10, Feb. 10, 2009, pp. 062103.

Sungho Woo et al., "Influence of nickel oxide nanolayer and doping in organic light-emitting devices", Journal of Industrial and Engineering Chemistry, vol. 15, www.elsevier.com/locate/jiec, Mar. 16, 2009, pp. 716-718.

I-Min Chan et al., "Enhanced hole injections in organic light-emitting devices by depositing nickel oxide on indium tin oxide anode.", Applied Physics Letters, vol. 81, No. 10, Sep. 2, 2002, pp. 1899.

* cited by examiner

ORGANIC EL DEVICE INCLUDING A MIXED HOLE INJECTION LAYER

TECHNICAL FIELD

The present invention relates to an organic electroluminescence device (hereinafter referred to as "organic EL device") that is an electric light-emitting device.

BACKGROUND ART

In recent years, progress has been made in research and development of diverse functional devices which involve use of an organic semiconductor.

One typical example of such functional devices is an organic EL device. The organic EL device, which is a current-driven light-emitting device, includes a pair of electrodes, i.e. an anode and a cathode, and a functional layer layered between the pair of electrodes, the functional layer containing an organic material. The functional layer includes a light-emitting layer, a buffer layer and the like. A hole injection layer for facilitating injection of holes may be inserted between the functional layer and the anode.

To drive the organic EL device, a voltage is applied to between the pair of electrodes to use the phenomenon of electroluminescence that occurs when holes injected from the anode into the functional layer recombine with electrons injected from the cathode into the functional layer. Being self-light-emissive, the organic EL device is highly visible. In addition, being a complete solid-state device, the organic EL device has excellent impact resistance. Owing to these advantages, more attention is being given to the applications of organic EL devices as a light-emitting device or a light source for various display apparatuses.

The organic EL device is roughly classified into two types depending on the type and forming method of the material of the functional layer. The first type is a vapor-deposition-type organic EL device in which a low molecular material is used as the main material of the functional layer, and a film of the functional layer is formed in a vacuum process such as a process by the vapor deposition method. The second type is a solution-deposition-type organic EL device in which a high molecular material or a low molecular material having excellent film formability is used as the material of the functional layer, and a film of the functional layer is formed in a wet process such as a process by the ink jet method or the gravure printing method.

Among these, the vapor-deposition-type organic EL device of the first type has been developed with priority due to high luminous efficiency of its light-emitting material having and its driving longevity, and has already been put into practical use in displays for mobile phones, small-scale televisions or the like. On the other hand, the solution-deposition-type organic EL device of the second type is effective in realizing a large-scale organic EL device, and the development has been continued as well.

Meanwhile, a variety of researches and developments are also underway for improving the luminous efficiency of the organic EL device. The targets of such researches and developments include the hole injection layer that, inserted between the functional layer and the anode, greatly contributes to the improvement of the luminous efficiency. Conventionally, it was common that the hole injection layer is formed from an organic material such as copper phthalocianine or PEDOT (electroconductive polymer). In recent years, however, attempts have been made to form the hole injection layer from a metal oxide such as nickel oxide or tungsten oxide (see Patent Literatures 1 and 2).

Among all, it has been reported that the organic EL device containing the hole injection layer made of a p-type metal oxide, such as nickel oxide, improves the hole injection efficiency and the luminance (see Non-Patent Literatures 1 and 2). In particular, it has been reported that, when the hole injection layer made of nickel oxide contains excess oxygen in the composition ratio and thus an increased proportion of $Ni^{3+}$, it can produce an excellent luminance (see Patent Literature 1 and Non-Patent Literature 3).

CITATION LIST

Patent Literature

Patent Literature 1: Japanese Patent Application Publication No. 09-260063
[Patent Literature 2] Japanese Patent Application Publication No. 2011-44445

Non-Patent Literature

[Non-Patent Literature 1] I-Min Chan et al., Appl. Phys. Lett. 81, 10, 1899 (2002)
[Non-Patent Literature 2] Sungho Woo et al., J. Ind. Eng. Chem. 15, 716 (2009)
[Non-Patent Literature 3] Suman Nandy et al., J. Mater. Sci. 42, 5766 (2007)
[Non-Patent Literature 4] Wei-Luen Jang et al., Appl. Phys. Lett. 94, 062103 (2009)

SUMMARY OF INVENTION

Technical Problem

However, the conventional technologies have a problem that solution-deposition-type organic EL devices having a hole injection layer made of nickel oxide cannot obtain a desired hole injection capability of the hole injection layer after the process of forming the functional layer. This is considered to be caused for the following reasons.

In the case where the functional layer is formed by a wet process, a solution containing an organic functional material is coated on the hole injection layer made of nickel oxide, and then a heating process is executed. The heating process is performed to volatilize and remove a solvent. The heating condition changes depending on the solvent used. For example, in a nitrogen atmosphere, the coated solution is heated to such a temperature at which the organic functional material does not change in quality or decompose, which is typically in an approximate range from one hundred to two hundred and several tens ° C. In that heating process, the hole injection layer made of nickel oxide is also heated in the temperature and atmosphere.

However, $Ni^{3+}$ is greatly reduced in number in the layer when the hole injection layer made of nickel oxide is subjected to the heating process performed in a nitrogen atmosphere in an approximate temperature range from one hundred to two hundred and several tens ° C. Thus, a problem of the conventional technologies is that, when the hole injection layer made of nickel oxide is adopted in a solution-deposition-type organic EL device, $Ni^{3+}$ in the hole injection layer may be reduced in number due to the heat applied during the process of forming the functional layer made of an organic material, and the hole injection efficiency may be decreased (Non-Patent Literature 4).

It is therefore an object of the present invention to provide an organic EL device that, in spite of having a hole injection layer that contains a p-type metal oxide, can produce a high hole injection efficiency even after passing through the heating process.

Solution to Problem

According to one aspect of the present invention, there is provided an organic EL device comprising: an anode and a cathode disposed to face each other with a gap therebetween; a functional layer that contains an organic material and is disposed between the anode and the cathode; and a hole injection layer that has a function to inject holes into the functional layer and is disposed between the anode and the functional layer, wherein the hole injection layer is a mixture layer containing a first oxide and a second oxide. In the organic EL device according to one aspect of the present invention, the first oxide is a p-type metal oxide, the composition of the second oxide contains an element that is thermally stable in both a first state where the element has the maximum valence and a second state where the element has a valence smaller than the maximum valence, the element being more thermally stable in the second state than in the first state. Furthermore, the element contained in the composition of the second oxide in the hole injection layer is in the first state.

Advantageous Effects of Invention

In the organic EL device according to one aspect of the present invention, the hole injection layer is a mixture layer containing the first oxide (p-type metal oxide) and the second oxide. Also, the composition of the second oxide contains the element that may be in the two above-described states of valences.

With the above-described structure of the organic EL device according to one aspect of the present invention, it is possible to excellently maintain a valence state in the hole injection layer that is effective for the hole injection, even in the heating process during the functional layer forming process of a solution-deposition-type organic EL device, thereby maintaining an excellent hole injection efficiency. This makes it possible to manufacture an organic EL device that can endure a mass-production process of an organic EL panel.

DESCRIPTION OF EMBODIMENTS

<<Aspect of Present Invention>>

According to one aspect of the present invention, there is provided an organic EL device comprising: an anode and a cathode disposed to face each other with a gap therebetween; a functional layer that contains an organic material and is disposed between the anode and the cathode; and a hole injection layer that has a function to inject holes into the functional layer and is disposed between the anode and the functional layer, wherein the hole injection layer is a mixture layer containing a first oxide and a second oxide. In the organic EL device according to one aspect of the present invention, the first oxide is a p-type metal oxide, the composition of the second oxide contains an element that is thermally stable in both a first state where the element has the maximum valence and a second state where the element has a valence smaller than the maximum valence, the element being more thermally stable in the second state than in the first state. Furthermore, the element contained in the composition of the second oxide in the hole injection layer is in the first state.

Note that in the above description, "thermally stable" means that a certain amount of the element of the valence can exist constantly without change. Note also that in the above description, "the element being more thermally stable in the second state than in the first state" means that, in a high-temperature environment, the certain amount of the element of the valence can be maintained more stably in the second state than in the first state.

Furthermore, in the above description, the "element" means at least one element other than oxygen among the elements constituting the oxide.

With the above-described structure of the organic EL device according to one aspect of the present invention, it is possible to excellently maintain a valence state that is effective for the hole injection, in the hole injection layer even in the heating process during the functional layer forming process of a solution-deposition-type organic EL device, thereby maintaining an excellent hole injection efficiency. This makes it possible to manufacture an organic EL device that can endure a mass-production process of an organic EL panel.

In the organic EL device according to one aspect of the present invention, a difference between the maximum valence and the valence smaller than the maximum valence of the element contained in the composition of the second oxide may be two. This difference in valence allows for a valence state, which is effective for the hole injection, of an element contained in the first oxide to be maintained excellently in the heating process.

In the organic EL device according to one aspect of the present invention, the element contained in the composition of the second oxide may be most stable in a state where a pair of electrons occupy an s orbital of the outermost shell. In other words, the element is an element that produces the inert pair effect.

In the organic EL device according to one aspect of the present invention, the element contained in the composition of the second oxide may be selected from the group consisting of Tl, Pb, Bi, and Sb; and In the organic EL device according to one aspect of the present invention, the composition of the first oxide may contain at least one element selected from the group consisting of Ni, Cu, Co, Fe, Cr, and Mn.

In the organic EL device according to one aspect of the present invention, an element contained in the composition of the first oxide may have a higher ionization tendency than the element contained in the composition of the second oxide.

<<Embodiment>>

The following describes an organic EL device 1 in an embodiment of the present invention, and results of performance confirmation experiments of the present invention and consideration thereof.

(Structure of Organic EL Device 1)

Figure 1:
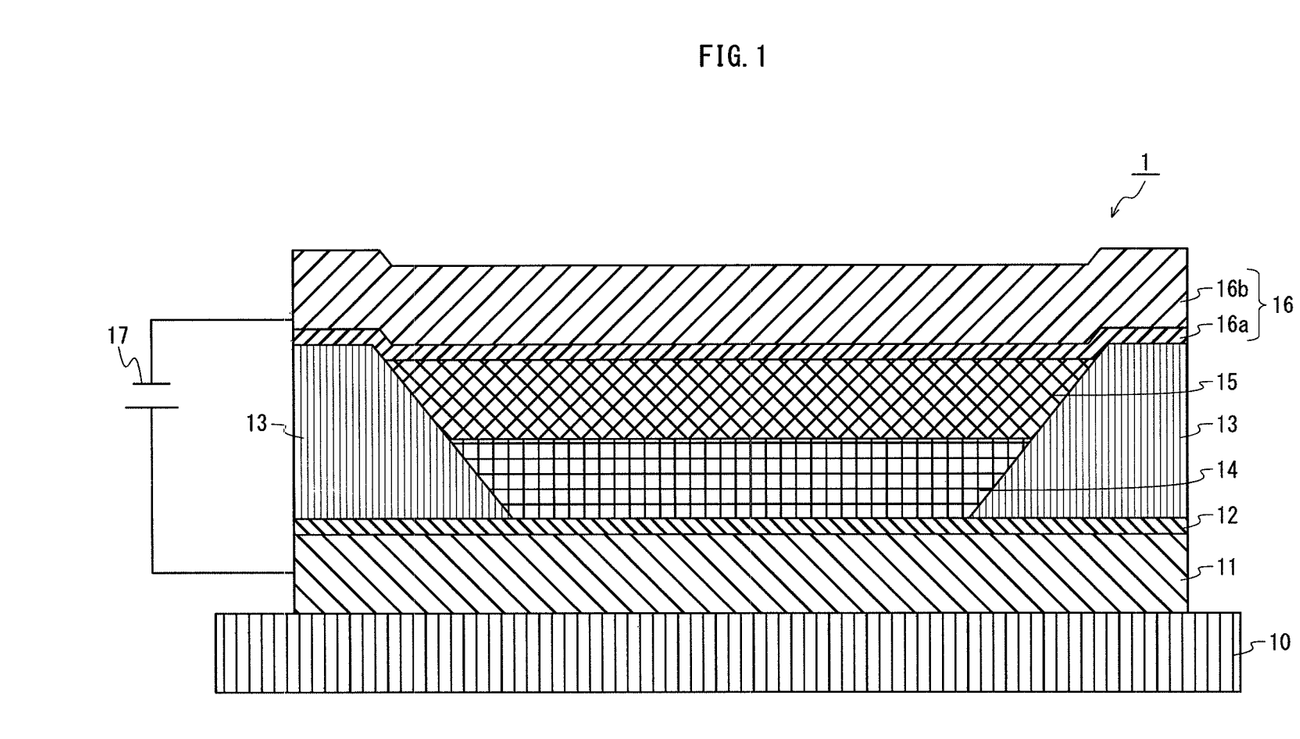
FIG. 1 is a schematic cross-sectional view illustrating the structure of an organic EL device 1 in the Embodiment.

FIG. 1 is a schematic cross-sectional view illustrating the structure of the organic EL device 1 in the Embodiment.

The organic EL device 1 in the present embodiment is a solution-deposition-type organic EL device that is manufactured by coating a functional layer by a wet process. More specifically, as illustrated in FIG. 1, in the organic EL device 1, an anode 1 and a hole injection layer 12 are laminated in the stated order on a main surface of a substrate 10. On the hole injection layer 12, a bank 13 is formed such that a part of the main surface of the hole injection layer 12 is exposed.

In the opening surrounded by the bank 13, a buffer layer 14 and a light-emitting layer 15 are laminated on the exposed surface of the hole injection layer 12 in the stated order, and a cathode 16 is further laminated on the light-emitting layer 15, the cathode 16 being composed of a barium layer 16a and an aluminum layer 16b. In other words, in the organic EL device 1, the hole injection layer 12 and several functional layers (in this example, the buffer layer 14 and the light-emitting layer 15) having predetermined functions are, in a laminated state, inserted between the anode 11 and the cathode 16 that are electrodes making a pair.

Note that, in the organic EL device 1, the anode 11 and the cathode 16 are connected to a DC power source 17.

<Anode>

The anode 11 is, for example, an ITO film having a thickness of 50 nm.

<Hole Injection Layer>

The hole injection layer 12 is, for example, a mixture layer of nickel oxide and bismuth oxide, with a thickness of 7.5 nm.

The hole injection layer 12 is desirably composed of only nickel, bismuth and oxygen as its elements, but may contain a minute amount of impurities that might mix therein in a normal level.

Here, a film of the hole injection layer 12 is formed under a predetermined condition, which is described below. The condition allows for $Ni^{3+}$ and $Bi^{5+}$, which is bismuth having the maximum valence thereof, to be contained. With this structure, the organic EL device 1 of the present embodiment can excellently maintain an enough amount of $Ni^{3+}$ in the hole injection layer 12 even after the baking process of the bank 13, buffer layer 14 and light-emitting layer 15.

<Bank>

On the surface of the hole injection layer 12, the bank 13 made of an insulating organic material (e.g., acrylic resin, polyimide resin, novolac-type phenolic resin, etc.) is formed in stripes or in a grid shape structure to have a predetermined trapezoidal shape in a cross section. A functional layer (the buffer layer 14, the light-emitting layer 15), which is made of an organic material and formed by a wet process, is formed in the opening surrounded by the bank 13.

Note that the bank 13 is not an indispensable structural element for the present invention, but may be omitted when, for example, the organic EL device 1 is used separately.

<Buffer Layer>

The buffer layer 14 is made of, for example, TFB(Poly(9,9-di-n-octylfluorene-alt-(1,4-phenylene-((4-sec-butylphenyl)imino)-1,4-phenylene), which is an amine-based organic polymer, and has a thickness of 20 nm.

<Light-Emitting Layer>

The light-emitting layer 15 is made of, for example, F8BT (Poly(9,9-di-n-octylfluorene-alt-benzothiadiazole)), which is an organic polymer, and has a thickness of 70 nm. However, the material of the light-emitting layer 15 is not limited to the above-described one, but may be another known organic material. Examples of the material in the light-emitting layer 15 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as described in Japanese Patent Application Publication No. H5-163488.

<Functional Layer>

As described above, the functional layer of the present invention is composed of the buffer layer 14 and the light-emitting layer 15. However, not limited to this structure, the functional layer may one of layers including these layers and a hole transport layer for transporting holes, or may be composed of a combination of two or more layers among these layers, or may be composed of all of these layers. The present embodiment is focused on the hole injection layer. However, other than the hole injection layer, the organic EL device includes the above-described hole transport layer and the light-emitting layer and the like that perform predetermined functions respectively. Here, the functional layer is meant to include one or more layers, other than the hole injection layer, that are necessary for the organic EL device.

<Others including Electrodes and Substrate>

The cathode 16 is made of, for example, a barium layer 16a having a thickness of 5 nm and an aluminum layer 16b having a thickness of 100 nm that are laminated in the stated order.

As described above, the DC power source 17 is connected to the anode 11 and the cathode 16 such that power is supplied to the organic EL device 1 from an external source.

The substrate 10 may be formed from any of insulating materials: alkali-free glass, soda glass, non-fluorescent glass, phosphate glass, borate glass, quartz, acrylic resin, styrenic resin, polycarbonate resin, epoxy resin, polyethylene, polyester, silicone resin, alumina, etc.

(Acts and Effects of Organic EL Device 1)

In the organic EL device 1 having the above-described structure, the hole injection layer 12, which is a mixture layer of nickel oxide and bismuth oxide, contains $Ni^{3+}$ and $Bi^{5+}$ that is bismuth having a valence of five that is the maximum valence thereof. With this structure, the organic EL device 1 of the present embodiment can excellently maintain an enough amount of $Ni^{3+}$ even after the baking process of the bank 13, buffer layer 14 and light-emitting layer 15, and thus can maintain a high hole injection efficiency.

(Manufacturing Method of Organic EL Device)

The following describes one example of an entire manufacturing method of the organic EL device 1.

First, the substrate 10 is placed in the chamber of a sputtering apparatus for film formation. A predetermined sputter gas is then introduced into the chamber to form a film of the anode 11 that is an ITO film having a thickness of 50 nm by, for example, the reactive sputtering method.

Next, a film of the hole injection layer 12 is formed preferably by the sputtering method. In particular, when the structure of the present embodiment is applied to a large-scale organic EL device for which a large-area film needs to be formed, there is a fear that an uneven film thickness may be caused when the film is formed by the vapor deposition method or the like. On the other hand, use of the sputtering method can easily avoid formation of such an uneven film.

To be specific, a film is formed by the reactive sputtering method, targeting nickel oxide (NiO) and dibismuth trioxide ($Bi_2O_3$). More specifically, argon gas and oxygen gas are introduced into the chamber to create an excess oxygen atmosphere, thereby allowing for nickel oxide to form $Ni^{3+}$, and further promoting oxidation of bismuth oxide to form $Bi^{5+}$ that is bismuth having the valence of five, the maximum valence, which is stable, as well as $Bi^{3+}$ that is bismuth having the valence of three and is the most stable.

Note that the term "stable" here means that a certain amount of an element of a valence can exist constantly without change, for example, in the air under the normal temperature and normal pressure or in a nitrogen atmosphere, and that the amount of the element of the valence may change during a heating process in the manufacturing process of the organic EL device 1.

Next, a bank material is prepared which is, for example, a photosensitive resist material, desirably a photoresist material containing a fluorine-based material. The bank material is coated uniformly on the surface of the hole injection layer 12. The coated bank material is then pre-baked, and then a mask with openings of a predetermined shape (with a pattern of the bank to be formed) is then overlaid thereon. Subsequently, the hole injection layer 12 with the mask thereon is exposed to light, then unhardened portions of the bank material are washed away by developer. The resultant is cleaned with pure water and the bank 13 is completed.

Next, ink (the solvent is, for example, xylene) of a composition containing an amine-based organic polymer is dropped on portions of surface of the hole injection layer 12 in the openings surrounded by the bank 13 and exposed to the air, in a wet process executed by the ink jet method, the gravure printing method or the like, and the solvent is volatilized to be removed by the heating process performed for 30 minutes at 130° C. in a nitrogen atmosphere. This completes the formation of the buffer layer 14.

Next, ink (the solvent is, for example, xylene) of a composition containing an organic light-emitting material is dropped on portions of surface of the buffer layer 14 by the same method as the above-described one, and the solvent is volatilized to be removed by the heating process performed for 10 minutes at 200° C. in a nitrogen atmosphere. This completes the formation of the light-emitting layer 15.

The methods for forming the buffer layer 14 and the light-emitting layer 15 are not limited to the above-described ones (the ink jet method and the gravure printing method), but any known method, such as the dispenser method, nozzle coat method, spin coat method, intaglio printing, or letterpress printing, may be used for dropping or coating ink.

Subsequently, on the surface of the light-emitting layer 15, films of the barium layer 16a and the aluminum layer 16b are formed in the stated order by the vacuum deposition method or the like. This completes the formation of the cathode 16.

Note that although not illustrated in FIG. 1, but for the purpose of restricting the organic EL device 1 from being exposed to the air, a sealing layer may further be formed on the surface of the cathode 16, or a sealing "can" may be placed for the whole organic EL device 1 to be isolated from the surrounding space.

The sealing layer may be made of, for example, a material such as SiN (silicon nitride) or SiON (silicon oxynitride) and may be formed such that it seals the whole organic EL device 1 inside.

The sealing "can" may be made of the same material as the substrate 10. Furthermore, a getter that adsorbs water or the like may be provided inside a closed space.

The organic EL device 1 is completed through the above-described steps.

(Various Experiments and Consideration)

<Effects of Bismuth Oxide on Nickel Oxide>

As described above, according to the present embodiment, the hole injection layer 12, which is a mixture layer of nickel oxide and bismuth oxide, contains $Bi^{5+}$ that is bismuth having the maximum valence thereof. This allows for an enough amount of $Ni^{3+}$ to be maintained excellently even after the execution of the heating process during the functional layer forming process. This was confirmed by the following experiments.

Three samples were manufactured by forming a film containing only nickel oxide and two mixture films of nickel oxide and bismuth oxide on the ITO substrate respectively by the sputtering film-forming method.

Table 1 illustrates the sputtering film-forming conditions for the samples.

TABLE 1

| Sample No. | Sample name | Target | Partial pressure ratio of argon gas to oxygen gas |
|---|---|---|---|
| 1 | NiO film | NiO | 10:0 |
| 2 | Bi—NiO film | NiO, $Bi_2O_3$ | 10:0 |
| 3 | O-increased Bi—NiO film | NiO, $Bi_2O_3$ | 5:5 |

In each of the samples, the input power, total pressure and film thickness were 200 W, 8 Pa and 7.5 nm, respectively. Note that in the following description, the sample numbers or sample names indicated in Table 1 are used.

The X-ray photoelectron spectroscopy (XPS) measurement was conducted on the manufactured samples.

Note that in general, an XPS spectrum reflects the electron states, such as the composition, binding state and valence, of elements that are present in an area ranging from the surface to a depth of several nm of the object of the measurement.

[Conditions for XPS Measurement]

Used equipment: X-ray photoelectron spectroscopy apparatus PHI5000 VersaProbe (made by ULVAC PHI, Inc.)

Light source: Al Kα radiation

Photoelectron emission angle: substrate normal line direction

Measurement point interval: 0.1 eV

[Measurement Results and Consideration]

Figure 2:
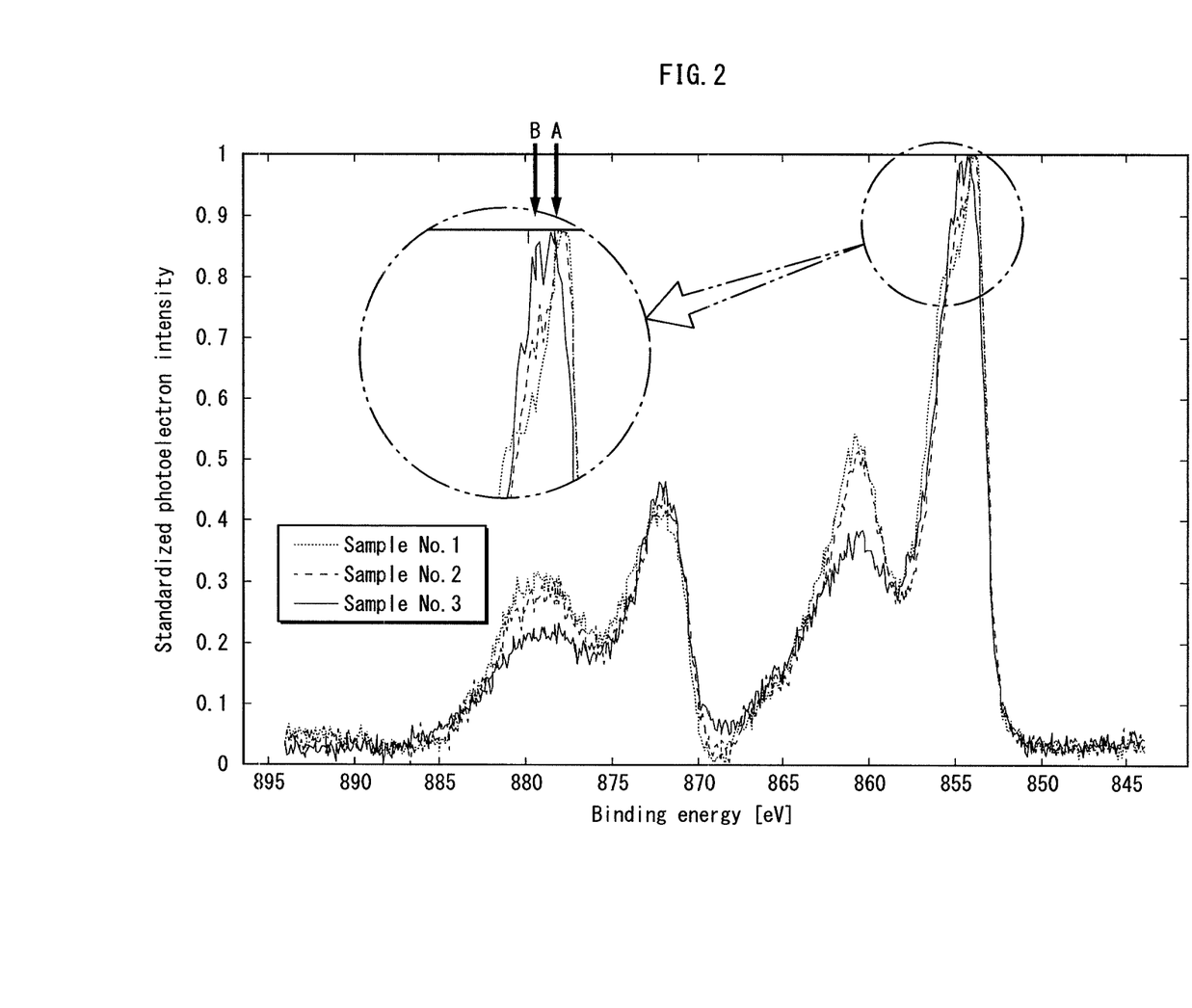
FIG. 2 illustrates spectra of Ni 2p that were obtained by conducting an X-ray photoelectron spectroscopy measurement on the samples No. 1 to No. 3.
Figure 3:
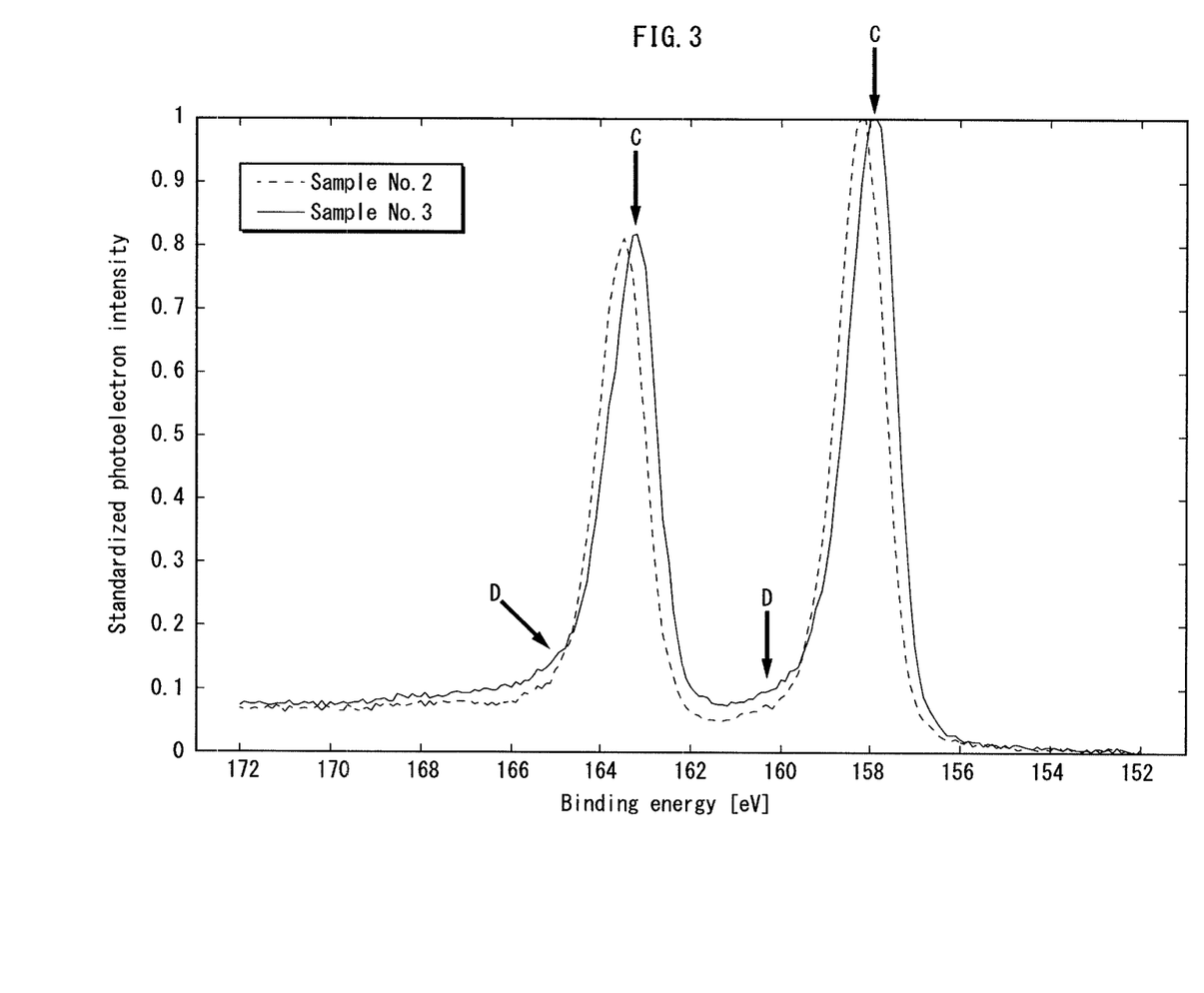
FIG. 3 illustrates spectra of Bi 4f that were obtained by conducting the X-ray photoelectron spectroscopy measurement on the samples No. 2 and No. 3.
Figure 4:
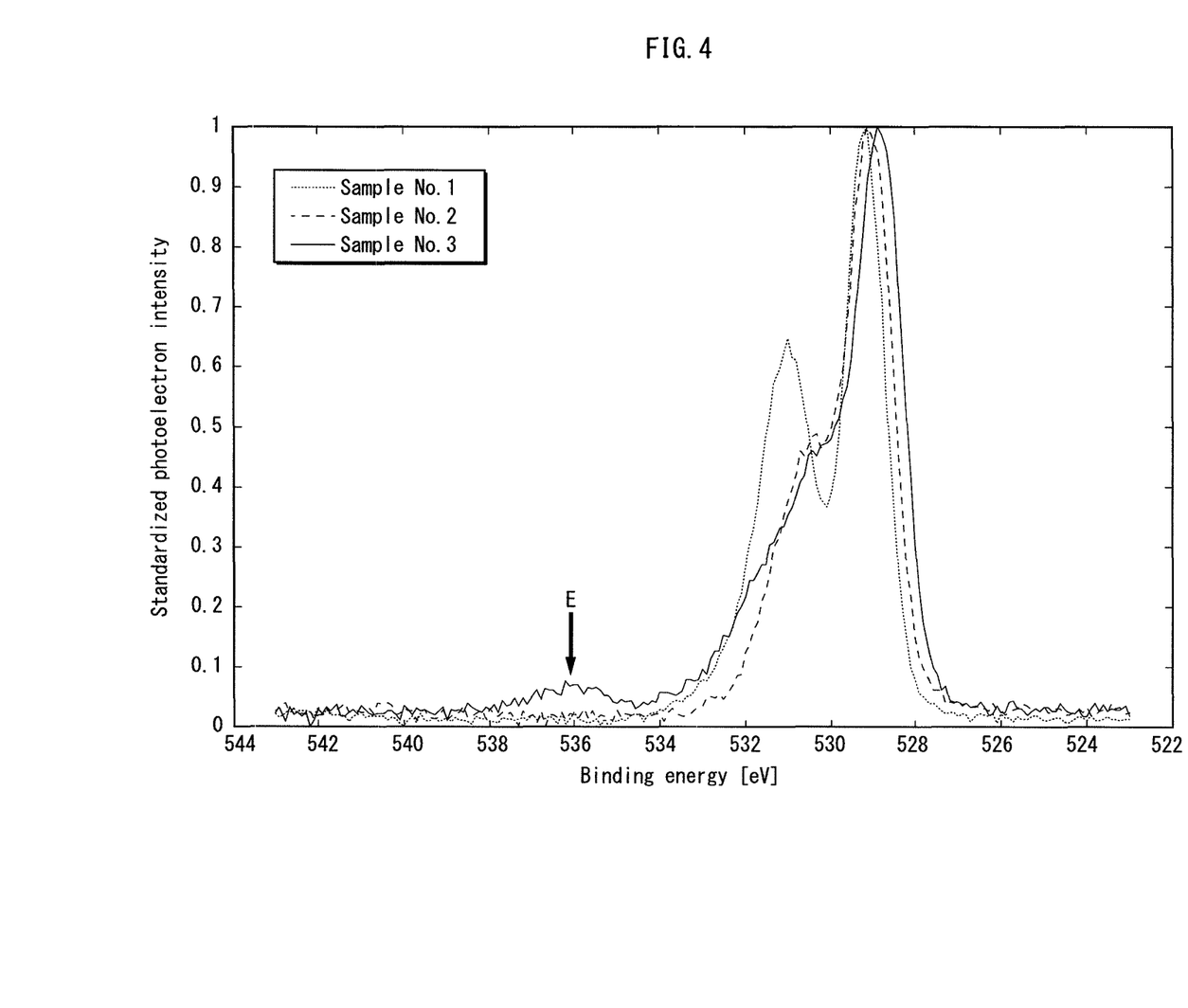
FIG. 4 illustrates spectra of O 1s that were obtained by conducting the X-ray photoelectron spectroscopy measurement on the samples No. 1 to No. 3.

FIGS. 2 to 4 illustrate spectra of the measurement results. Note that in FIGS. 2 to 4, the horizontal axis represents the binding energy, and the vertical axis represents the photoelectron intensity standardized by the maximum value of each spectrum.

FIG. 2 illustrates the spectra of Ni 2p in samples No. 1 to No. 3. In FIG. 2, the peak pointed to by the arrow A is attributed to $Ni^{2+}$ and the shoulder region pointed to by the arrow B is attributed to $Ni^{3+}$.

From the spectra illustrated in FIG. 2, it is understood that the sample No. 3, "O-increased Bi—NiO film" has the highest ratio of $Ni^{3+}$ to $Ni^{2+}$.

FIG. 3 illustrates the spectra of Bi 4f in samples No. 2 and No. 3. In FIG. 3, the two peaks pointed to by the arrows C are attributed to $Bi^{3+}$ and the two shoulder regions pointed to by the arrows D are attributed to $Bi^{5+}$.

The spectra illustrated in FIG. 3 show that both sample No. 2 "Bi—NiO film" and sample No. 3 "O-increased Bi—NiO film" have $Bi^{5+}$, and in particular, the sample No. 3 "O-increased Bi—NiO film", which has a high oxygen partial pressure according to the film-forming conditions indicated in Table 1 and is considered to promote oxidization of bismuth during the film formation, has a high ratio of $Bi^{5+}$ to $Bi^{3+}$.

FIG. 4 illustrates the spectra of O 1s in samples No. 1 to No. 3. In FIG. 4, the peaks observed in sample No. 2 "Bi—NiO film" and sample No. 3 "O-increased Bi—NiO film", pointed to by the arrow E on the high binding energy side, indicate the presence of a bonding state that has stronger covalent bonding property than Bi—O bond or Ni—O bond, which is considered to be caused by the presence of $O_2$ molecules formed from surplus oxygen, as one example.

The above-described results indicate that samples containing a larger amount of $Bi^{5+}$ contain a larger amount of $Ni^{3+}$ and have $O_2$ molecules or the like having been formed in the film. This is explained by the following ionic reaction formulas.

$$Bi^{5+}+2e^- \rightarrow Bi^{3+} \quad \text{[Formula 1]}$$

$$Ni^{2+} \rightarrow Ni^{3+}+e^- \quad \text{[Formula 2]}$$

In this state, Bi—O bonds are broken, and thus surplus oxygen is generated and deposited as $O_2$.

This can be represented in the form of chemical reaction between oxides as follows.

$$2Bi_2O_5+4NiO \longleftrightarrow 2Bi_2O_3+2Ni_2O_3+O_2 \quad \text{[Formula 3]}$$

In Formula 3, as the amount of $Bi^{5+}$ ($Bi_2O_5$) increases, the reaction progresses in the rightward direction and the amount of $Ni^{3+}$ ($Ni_2O_3$) increases.

As described above, it is understood that, in a mixture film of nickel oxide and bismuth oxide that contains $Bi^{5+}$, $Bi^{5+}$ changes to $Bi^{3+}$ that is thermally stable, and in that process, the amount of $Ni^{3+}$ is increased.

By the effect of $Bi^{5+}$ promoting the formation of $Ni^{3+}$, the hole injection layer 12 of the organic EL device 1 of the present embodiment, which is a mixture layer of nickel oxide and bismuth oxide, maintains an enough amount of $Ni^{3+}$ excellently even after the execution of the heating process during the functional layer forming process. This allows for an excellent hole injection efficiency to be maintained. In particular, in the heating process executed during the process of forming the bank 13, buffer layer 14 and light-emitting layer 15, as the temperature increases, a more amount of $Bi^{5+}$ changes to $Bi^{3+}$, and the reaction represented by Formula 3 above progresses further in the rightward direction. Thus, while $Ni^{3+}$ would be lost by a heating process in common conditions, the structure of the present embodiment has an effect of supplying $Ni^{3+}$ to the contrary.

Accordingly, in the hole injection layer 12 of the organic EL device 1 of the present embodiment, even after the heating process of the bank 13, buffer layer 14 and light-emitting layer 15, reduction of $Ni^{3+}$ is restricted, thereby an excellent hole injection efficiency is ensured and a low-voltage driving is realized.

For the confirmation of the above, two types of devices for evaluation were manufactured, wherein in one type of device, the hole injection layer is a "NiO film", and in the other type of device, the hole injection layer is an "O-increased Bi—NiO film". Note that as the two types of devices for evaluation, "hole-only devices" were manufactured so as to evaluate accurately how the presence of $Bi^{5+}$, which is considered to promote the formation of $Ni^{3+}$, has an effect on the hole injection efficiency.

In the organic EL device, carriers that form electric current are composed of holes and electrons, and thus the electric characteristics of the organic EL device reflect the electron current, as well as the hole current.

However, in the hole-only devices for evaluation, injection of electrons from the cathode is inhibited, thus the electron current flows hardly, and the entire current is almost the hole current. That is to say, in the hole-only devices for evaluation, most of the carriers may be regarded as holes. Such hole-only devices are suitable for the evaluation of the hole injection efficiency.

Figure 5:
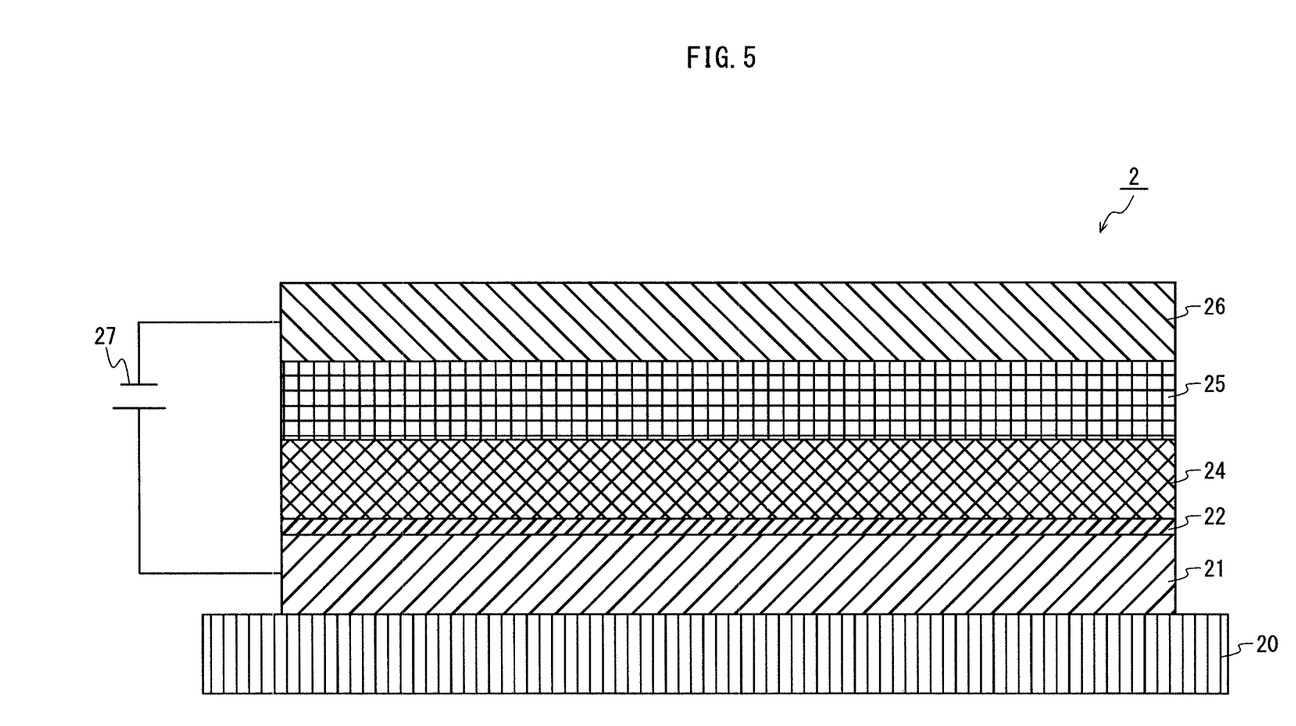
FIG. 5 is a schematic cross-sectional view illustrating the structure of the hole-only devices 2 manufactured for the evaluation of the hole injection efficiency.

More specifically, as illustrated in FIG. 5, hole-only devices 2, which were manufactured, each include an anode 21, a hole injection layer 22, a buffer layer 24, a light-emitting layer 25, and a cathode 26 that are laminated in the stated order on a substrate 20, wherein the anode 21 is an ITO thin film having a thickness of 50 nm, the hole injection layer 22 is a mixture layer of nickel oxide and bismuth oxide having a thickness of 7.5 nm, the buffer layer 24 is formed from TFB, which is an amine-based organic polymer, and has a thickness of 20 nm, the light-emitting layer 25 is formed from F8BT, which is an organic polymer, and has a thickness of 70 nm, and the cathode 26 is formed from Au (gold) and has a thickness of 100 nm. In other words, the hole-only devices 2 for evaluation have a similar structure to the organic EL device 1 of the present embodiment illustrated in FIG. 1, but are mainly characterized in that the cathode 16 has been replaced with the cathode 26 made of Au (gold).

Note that the buffer layer 24 and the light-emitting layer 25 have been subjected to respective heating processes. Note also that the bank is omitted in the hole-only devices 2 since they are devices for evaluation.

In one of the two types of hole-only devices 2 having the above-described structure, a "NiO film" is adopted as the hole injection layer 22; and in the other of the two types of hole-only devices 2, an "O-increased Bi—NiO film" is adopted as the hole injection layer 22.

Each of the manufactured two types of hole-only devices 2 was connected to a DC power source 27, and a voltage was applied. The applied voltage was varied, and values of the current flowing in response to the respective voltage values were converted to current densities, namely, values of the hole-only devices 2 per unit area. In the following description, a "driving voltage" refers to an applied voltage when the current density is 10 mA/cm$^2$.

The smaller the driving voltage is, the higher the hole injection efficiency is. This is because the structural elements of the two types of hole-only devices 2 have been formed in the same manner, except for the hole injection layer 22, and thus the hole injection barrier between two adjacent layers, excluding the hole injection layer 22, is considered to be constant. Accordingly, a difference in driving voltage is generated by the difference in film-forming conditions of the hole injection layer 22, and the difference in driving voltage highly reflects the hole injection efficiency of the hole injections from the anode 21 to the hole injection layer 22 and from the hole injection layer 22 to the buffer layer 24.

As an amount of $Ni^{3+}$ in the hole injection layer 22 increases, namely, as the conversion of nickel oxide into p-type progresses and p-type carriers increase in the hole injection layer 22, the interface between the anode 21 and the hole injection layer 22 becomes close to the ohmic connection, and the conductivity of the hole injection layer 22 itself improves.

Furthermore, as an amount of $Ni^{3+}$ in the hole injection layer 22 increases, it becomes easier for electrons to flow from the buffer layer 24 into $Ni^{3+}$ in the hole injection layer 22 at the interface between the hole injection layer 22 and the buffer layer 24, which allows the hole injection barrier between the hole injection layer 22 and the buffer layer 24 to be lowered.

In this way, as the amount of $Ni^{3+}$ in the hole injection layer 22 increases, the hole injection efficiency of the hole-only devices 2 improves as a whole, which appears as a reduction in the driving voltage.

Figure 6:
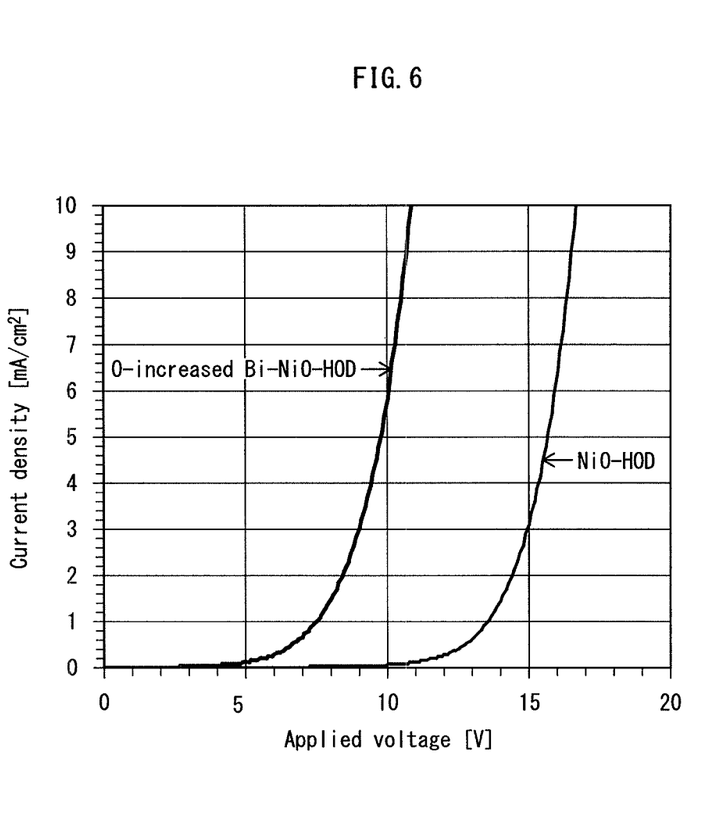
FIG. 6 is a diagram illustrating the current density versus applied voltage curves of the two types of hole-only devices 2.

FIG. 6 illustrates current density versus applied voltage curves of the two types of hole-only devices 2 that differ in the structure of the hole injection layer 22.

In FIG. 6, the vertical axis represents the current density ($mA/cm^2$) and the horizontal axis represents the applied voltage (V). Note that a hole-only device 2 in which a "NiO film" is adopted as the hole injection layer 22 is denoted as "NiO-HOD", and a hole-only device 2 in which an "O-increased Bi—NiO film" is adopted as the hole injection layer 22 is denoted as "O-increased Bi—NiO-HOD".

As illustrated in FIG. 6, the "O-increased Bi—NiO-HOD" has a lower driving voltage and a faster rise of the current density versus applied voltage curve than the "NiO-HOD". That is to say, the "O-increased Bi—NiO-HOD" allows for a higher current density to be obtained with a lower driving voltage than the "NiO-HOD".

The reason for this is considered to be that in the "O-increased Bi—NiO-HOD", due to the presence of $Bi^{5+}$ in the hole injection layer 22, an enough amount of $Ni^{3+}$ is maintained excellently even after the execution of the heating process during the manufacturing process, and degradation of the hole injection capability is restricted.

Up to now, a description has been given of a verification of the hole injection efficiency in the two types of hole-only devices 2. As described above, the two types of hole-only devices 2 have the same structure as the organic EL device 1 in the present embodiment illustrated in FIG. 1, except for the structure of the cathode. Accordingly, the effect of $Bi^{5+}$, which promotes the formation of $Ni^{3+}$ in the hole injection layer 12 of the organic EL device 1, on the hole injection efficiency is substantially the same as the hole injection layer 22 of the two types of hole-only devices 2.

<<Other Considerations>>

In the above-described embodiment, a mixture layer of nickel oxide and bismuth oxide is used as the hole injection layer. However, the present invention is not limited to this combination. For example, elements, which are stable with the maximum valence and with a valence lower than the maximum valence, such as Bi, include Pb, Tl, and Sb. These elements are known to be the most stable when a pair of electrons occupy the s orbital of the outermost shell (inert pair effect). Accordingly, these elements have the maximum valence state (a state where all electrons have been taken away from the s orbital of the outermost shell) in which they are stable, and a state of a valence lower by two than the maximum valence (a state where a pair of inert electrons occupy the s orbital of the outermost shell) in which they are more stable than in the maximum valence state. Thus, any of these elements may be used to obtain a similar effect to Bi of the present embodiment.

Furthermore, according to the present invention, the p-type metal oxide may contain at least one of Ni, Cu, Co, Fe, Cr, and Mn as a constituent element.

Furthermore, according to the present invention, among the two types of oxides constituting the hole injection layer, a metal element contained in the p-type metal oxide may have a higher ionization tendency than an element contained in the other oxide, the element being stable with the maximum valence thereof and more stable with a valence that is lower than the maximum valence. With this structure, due to the change of the above-mentioned element from the maximum valence state to the most stable valence state, a metal element in a p-type metal oxide is oxidized (the conversion into p-type is promoted) more effectively, and a higher hole injection efficiency is expected.

Furthermore, according to the present invention, elements of the hole injection layer that is a mixture layer may be mixed in the atom level or may be phase separated. For example, in the case of a mixture layer of nickel oxide and bismuth oxide, the elements therein may be in the state of glass or a Ni—Bi—O compound in which a Ni atom and a Bi atom are close to each other, or may be separated into grains of crystals of NiO, $Bi_2O_3$, $Bi_2O_5$ or the like. In the latter case, it is possible to cause an ion reaction between $Ni^{3+}$ and $Bi^{5+}$ that are in contact at the grain boundary.

INDUSTRIAL APPLICABILITY

The present invention is useful for achieving various types of display panels including a large-screen television display, and an organic EL device that can be used as various types of light sources and is driven with a low voltage for a wide range of, from low to high, luminance.

REFERENCE SIGNS LIST 1 organic EL device
2 hole-only device
10, 20 substrate
11, 21 anode
12, 22 hole injection layer
13 bank
14, 24 buffer layer
15, 25 light-emitting layer
16, 26 cathode
16a barium layer
16b aluminum layer
17, 27 DC power source

The invention claimed is:
1. An organic EL device comprising:
an anode and a cathode disposed to face each other with a gap therebetween;
a functional layer that contains an organic material and is disposed between the anode and the cathode; and
a hole injection layer that has a function to inject holes into the functional layer and is disposed between the anode and the functional layer, wherein
the hole injection layer is a mixture layer containing a first oxide and a second oxide,
the first oxide is a p-type metal oxide, a composition of the second oxide contains an element M, the element M being expressible as $M^{\alpha+}$ when in a first state, the element M being expressible as $M^{\beta+}$ when in a second state, $\alpha$ and $\beta$ being valence numbers satisfying $\alpha > \beta$, $\alpha$ being a maximum valence number, both $M^{\alpha+}$ and $M^{\beta+}$ being thermally stable, and $M^{\beta+}$ being more thermally stable than $M^{\alpha+}$, and in the hole injection layer, the second oxide contains the element M at least as $M^{\alpha+}$.

2. The organic EL device of claim 1, wherein a difference between $\alpha$ and $\beta$ is two.

3. The organic EL device of claim 1, wherein the element M contained in the composition of the second oxide is most stable in a state where a pair of electrons occupy an s orbital of an outermost shell.

4. The organic EL device of claim 1, wherein the element M contained in the composition of the second oxide is selected from the group consisting of Tl, Pb, Bi, and Sb.

5. The organic EL device of claim 1, wherein a composition of the first oxide contains at least one element selected from the group consisting of Ni, Cu, Co, Fe, Cr, and Mn.

6. The organic EL device of claim 1, wherein an element contained in a composition of the first oxide has a higher ionization tendency than the element M contained in the composition of the second oxide.

7. The organic EL device of claim 1, wherein the element M being expressible as $M^{\alpha+}$ in the first state is bismuth having a valence of five.

* * * * *